United States Patent
Lee et al.

(10) Patent No.: US 9,627,236 B2
(45) Date of Patent: Apr. 18, 2017

(54) SUBSTRATE TREATING APPARATUS

(71) Applicant: SEMES CO., LTD., Chungcheongnam-do (KR)

(72) Inventors: Sang Jin Lee, Chungcheongnam-do (KR); Ji Hoon Choi, Chungcheongnam-do (KR); Doo Jin Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 14/681,506

(22) Filed: Apr. 8, 2015

(65) Prior Publication Data
US 2015/0290685 A1   Oct. 15, 2015

(30) Foreign Application Priority Data
Apr. 11, 2014   (KR) .................. 10-2014-0043692

(51) Int. Cl.
*H01L 21/67* (2006.01)
(52) U.S. Cl.
CPC .... *H01L 21/6719* (2013.01); *H01L 21/67051* (2013.01); *H01L 21/67126* (2013.01)
(58) Field of Classification Search
CPC .............. H01L 21/67769; F16K 51/02; Y10S 414/139; Y10S 414/14
USPC .... 134/200, 1.1, 902, 1.2, 18; 118/719, 733, 118/723 MA, 723 MR, 500; 414/217, 414/939, 940, 937, 935, 805, 153; 251/193, 326, 328, 129.11, 65
See application file for complete search history.

(56) References Cited

U.S. PATENT DOCUMENTS

| | | | | |
|---|---|---|---|---|
| 5,820,104 A | * | 10/1998 | Koyano ................ | F16K 51/02 251/129.15 |
| 5,939,130 A | * | 8/1999 | Shiraishi ............... | G03F 7/162 118/52 |

FOREIGN PATENT DOCUMENTS

| | | | | |
|---|---|---|---|---|
| KR | 2002-0074311 A | 9/2002 | | |
| KR | 2005-0050354 A | 5/2005 | | |
| KR | 2005-0109258 A | 11/2005 | | |
| KR | 2008-0062294 A | 7/2008 | | |
| KR | 2010-0065695 A | 6/2010 | | |
| KR | 100978368 B1 | * | 8/2010 | ............. G02F 1/13 |
| KR | 101040431 B1 | 6/2011 | | |
| KR | 2012-0131485 A | 12/2012 | | |

OTHER PUBLICATIONS

Chung, Hanrok, "The Board Feeding System of the Sputtering Reducing Friction" Aug. 2010, KR 10-0978368—Machine Translation.*

* cited by examiner

*Primary Examiner* — David Cormier
*Assistant Examiner* — Thomas Bucci
(74) *Attorney, Agent, or Firm* — Carter, DeLuca, Farrell & Schmidt, LLP

(57) ABSTRACT

A substrate treating apparatus is provided which includes housing and a door assembly. The housing provides a process space for treating a substrate therein and has an opening formed at a sidewall thereof. The door assembly opens and closes the opening. The door assembly includes a shutter, a driving member, and a gap maintaining unit. The driving member transfers the shutter to an open position where the shutter faces to the opening and to a blocking position where the shutter gets out of the open position. The gap maintaining unit maintains a constant gap between the shutter and the sidewall.

10 Claims, 6 Drawing Sheets

FIG. 1

PRIOR ART

SUBSTRATE TREATING APPARATUS

CROSS-REFERENCE TO RELATED APPLICATIONS

A claim for priority under 35 U.S.C. §119 is made to Korean Patent Application No. 10-2014-0043692 filed Apr. 11, 2014, in the Korean Intellectual Property Office, the entire contents of which are hereby incorporated by reference.

BACKGROUND

Embodiments of the inventive concepts described herein relate to an apparatus for treating a substrate.

To manufacture a semiconductor device or a liquid crystal display, a substrate may be treated using the following processes: photolithography, etching, ashing, ion-injection, and thin film deposition, etc. A process for cleaning the wafer may be performed before or after a process in order to remove contamination or particle generated during each process.

In general, a substrate treating process may be carried out in an inner space of housing. Upon processing the substrate, an inlet formed at the housing may be blocked by a shutter if the substrate is inserted through the inlet. Down-flow air current may be formed in the housing during a process and may prevent process by-product generated in the inner space from being diffused.

Figure 1:
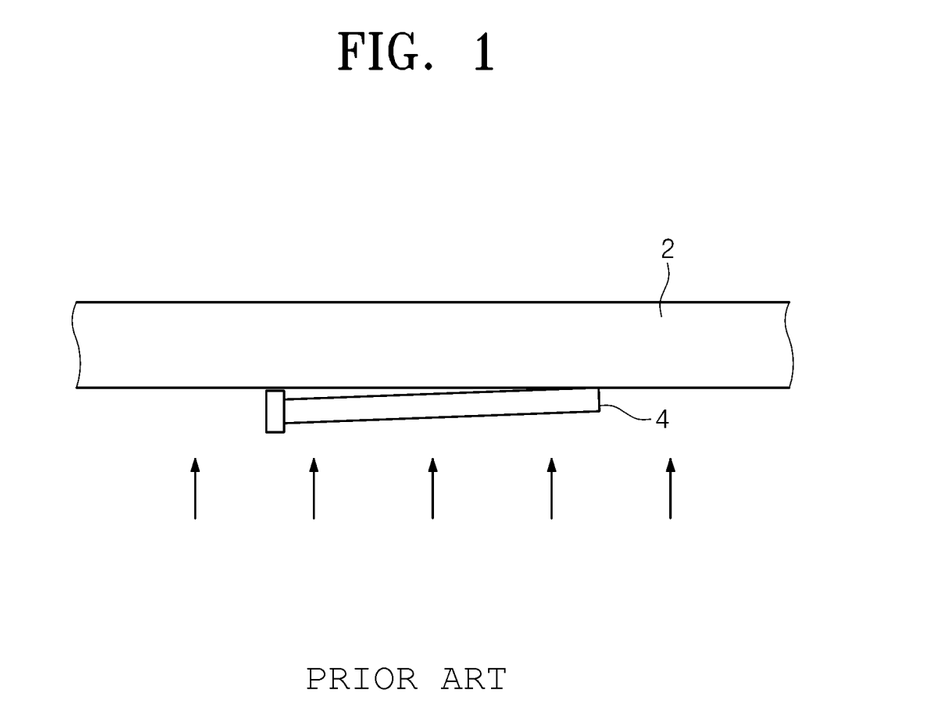
FIG. 1 is a plan view of a conventional substrate treating apparatus.

FIG. 1 is a plan view of a conventional substrate treating apparatus. Referring to FIG. 1, a portion of air current formed in an inner space of housing may apply pressure to a shutter 4 for opening and closing an inlet. In this case, the shutter 4 may move with it contacting with an inner surface of housing 2, so particle is generated due to friction between the shutter 4 and the housing 2.

When a high-temperature chemical process is carried out in the inner space of the housing 2, the shutter may be thermally deformed due to high temperature occurring during a process. For this reason, the shutter 4 may rub against the housing 2, thereby generating particle.

The particle in the housing 2 generated due to friction between the shutter 4 and the housing 2 may have a bad influence on a substrate treating process.

SUMMARY

Embodiments of the inventive concepts provide an apparatus capable of improving efficiency of a substrate treating process.

Embodiments of the inventive concepts also provide an apparatus an apparatus capable of preventing particle from being generated when a shutter moves with it contacting with housing.

One aspect of embodiments of the inventive concept is directed to provide a substrate treating apparatus which includes housing and a door assembly. The housing may provide a process space for treating a substrate therein and having an opening formed at a sidewall thereof. The door assembly may open and close the opening. The door assembly may include a shutter, a driving member, and a gap maintaining unit. The driving member transfers the shutter to a blocking position where the shutter faces to the opening and to an open position where the shutter gets out of the blocking position. The gap maintaining unit may maintain a constant gap between the shutter and the sidewall.

The gap maintaining unit may maintain the constant gap using magnetism. The gap maintaining unit may contain an inner magnetism member provided at the shutter; and an outer magnetism member placed at the outside of the shutter to face to the inner magnetism member. The inner magnetism member and the outer magnetism member may be configured such that repulsive power acts between the inner magnetism member and the outer magnetism member. One end of the shutter may be connected to the driving member, and the inner magnetism member may be provided at the other end of the shutter. The substrate treating apparatus may further include a guide member configured to guide a movement of the shutter and having a body placed to be spaced from the shutter. The body may have a first plate and a second plate spaced from and opposite to each other. The other end of the shutter may be s inserted between the first plate and the second plate. The outer magnetism member may include a first outer magnetic provided at the first plate; and a second outer magnetic provided at the second plate. Magnetism of each of the first and second outer magnetics may have greater than that of the inner magnetism member. The first and second outer magnetics may have the same magnetism. The inner magnetism member may include a first inner magnetic provided at the other end of the shutter; and a second inner magnetic provided at one end of the shutter. The outer magnetism member may include a third outer magnetic provided at the sidewall to face to the second inner magnetic. The outer magnetism member may be extended from a position facing to the blocking position up to an area facing to the open position. The substrate treating apparatus may further include a fan filter unit, a substrate support unit, and a liquid supply unit. The fan filter unit may form an air current at the process space. The substrate support unit may support a substrate at the process space. The liquid supply unit may supply a liquid on the substrate supported by the substrate support unit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

In this specification, there will be described an apparatus for cleaning a surface of a substrate using high-temperature chemical. However, the scope and spirit of the inventive concept may not be limited thereto. For example, the inventive concept may be applicable to various processes such as a deposition process, a develop process, an etching process, an ashing process, etc.

Hereinafter, an embodiment of the inventive concept will be more fully described with reference to FIGS. 2 to 7.

Figure 2:
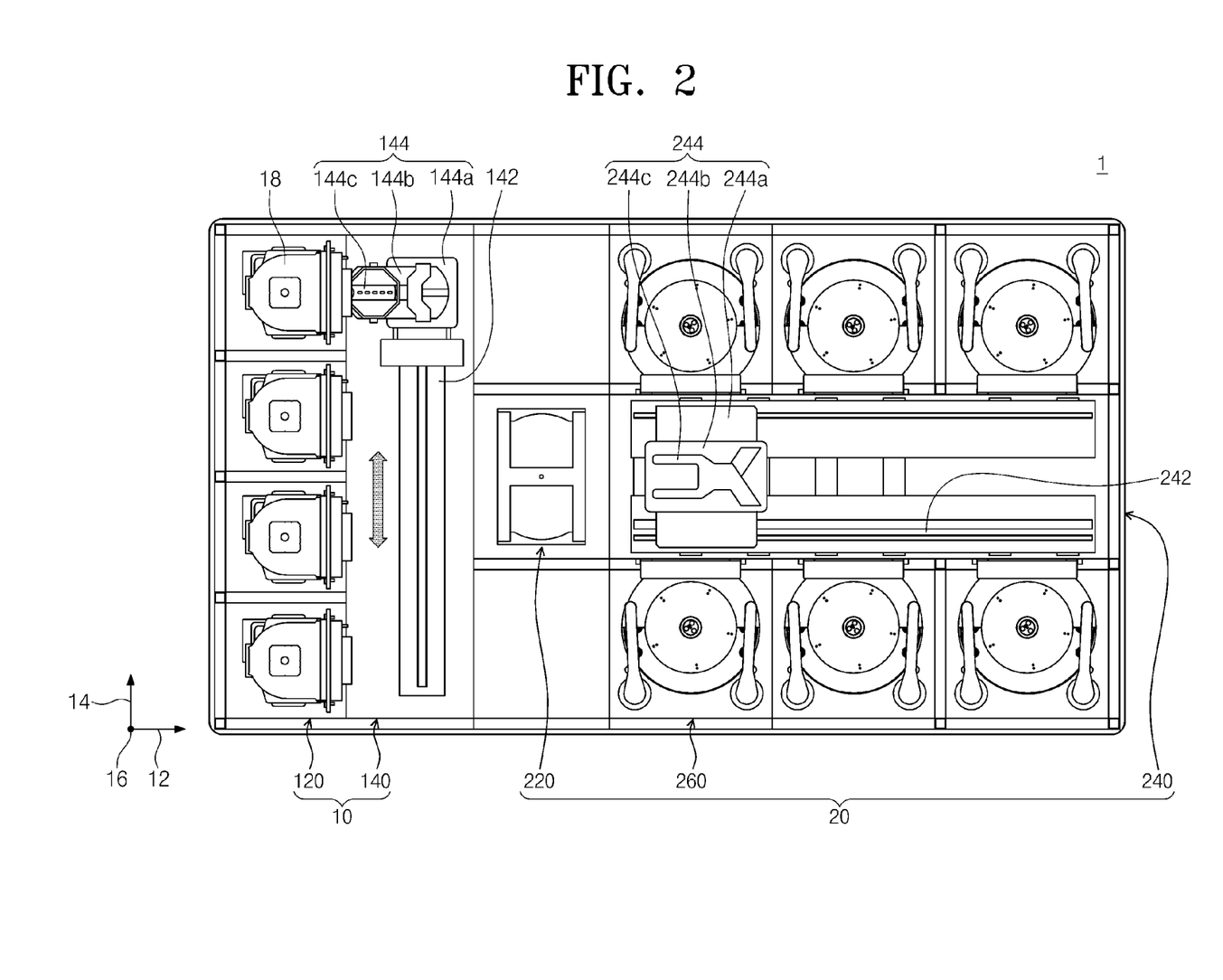
FIG. 2 is a plan view of a substrate treating apparatus according to an exemplary embodiment of the inventive concept.

FIG. 2 is a plan view of a substrate treating apparatus according to an exemplary embodiment of the inventive concept. Referring to FIG. 2, a substrate treating apparatus 1 may have an index module 10 and a process treating module 20. The index module 10 may contain a load port 120 and a transfer frame 140. The load port 120, the transfer frame 140, and the process treating module 20 may be arranged sequentially in line. Hereinafter, a direction where load port 120, the transfer frame 140, and the process treating module 20 are arranged is referred to as "first direction" 12, a direction perpendicular to the first direction 12 when viewed from the above may be referred to as "second direction" 14, and a direction perpendicular to a plane defined by the first direction 12 and the second direction 14 may be referred to as "third direction" 16.

A carrier 130 where a substrate W is received may be safely put on the load port 140. The load port 120 may be in plurality, and the plurality of load ports 120 may be arranged in line along the second direction 14. The number of load ports 120 may increase or decrease according to process efficiency, footprint condition, etc. A plurality of slots (not shown) may be formed at the carrier 130 such that substrates W are arranged to be perpendicular with respect to a ground. A Front Opening Unified Pod (FOUP) may be used as the carrier 130.

The process treating module 20 may contain a buffer unit 220, a transfer chamber 240, and process chambers 260. The transfer chamber 240 may be arranged such that its length direction is parallel with the first direction 12. The process chambers 260 may be arranged at both sides of the transfer chamber 240. The process chambers 260 may be arranged at one side and the other side of the transfer chamber 240 so as to be symmetrical on the basis of the transfer chamber 240. A plurality of process chambers 260 may be provided at the one side of the transfer chamber 240. A portion of the process chambers 260 may be arranged along a length direction of the transfer chamber 240. Also, a portion of the process chambers 260 may be arranged to be stacked. That is, the process chambers 260 may be arranged in an A-by-B matrix at the one side of the transfer chamber 240. Here, "A" may indicate the number of process chambers 260 arranged in line along the first direction 12, and "B" may indicate the number of process chambers 260 arranged in line along the third direction 16. When four or six process chambers 260 are arranged at the one side of the transfer chamber 240, the process chambers 260 may be arranged in a 2-by-2 or 3-by-2 matrix. The number of process chambers 260 may increase or decrease. Unlike the above description, the process chambers 260 can be provided only at one side of the transfer chamber 240. Also, the process chambers 260 can be arranged at one side and both sides of the transfer chamber 240 to form a single layer.

The buffer unit 220 may be disposed between the transfer frame 140 and the transfer chamber 240. The buffer unit 220 may provide a space where a substrate W stays before transferred between the transfer chamber 240 and the transfer frame 140. A slot(s) (not shown) where a substrate W is placed may be provided in the buffer unit 220. A plurality of slots may be provided to be spaced from each other along the third direction 16. The buffer unit 220 may have an opened surface that faces to the transfer frame 140 and an opened surface that faces to the transfer chamber 240.

The transfer frame 140 may transfer a wafer W between the buffer unit 220 and the carrier 130 put on the load port 120. An index rail 142 and an index robot 144 may be provided at the transfer frame 140. The index rail 142 may be provided such that its length direction is parallel with the second direction 14. The index robot 144 may be mounted on the index rail 142 and may move in a straight line toward the second direction 14 along the index rail 142. The index robot 144 may contain a base 144a, a body 144b, and an index arm 144c. The base 144a may be installed to be movable along the index rail 142. The body 144b may be joined to the base 144a. The body 144b may be configured to be movable on the base 144a along the third direction 16. Also, the body 144b may be configured to be rotatable on the base 144a. The index arm 144c may be joined to the body 144b such that it is forward and backward movable with respect to the body 144b. The index arm 144c may be in plurality, and the plurality of index arms 144c may be driven independently of each other. The index arms 144c may be arranged to be stacked under the condition that index arms 144c are spaced from each other along the third direction 16. A portion of the index arms 144c may be used to transfer a substrate W from the process treating module 20 to the carrier 130, and a portion of remaining index arms 144c may be used to transfer the substrate W from the process treating module 20 to the carrier 130, thereby preventing particle, generated from a substrate W not experiencing process treating when the substrate W is carried into or taken out of by the index robot 114, from be attached to the substrate W.

The transfer chamber 240 may transfer a substrate W between the buffer unit 220 and the process chamber 260 and between the process chambers 260. A guide rail 242 and a main robot 244 may be provided at the transfer chamber 240. The guide rail 242 may be arranged such that its length direction is parallel with the first direction 12. A guide rail 242 and a main robot 244 may be provided at the transfer chamber 240. The guide rail 242 may be arranged such that its length direction is parallel with the first direction 12. The main robot 244 is installed on the guide rail 242 and may move in a straight line along the first direction 12 on the guide rail 242. The main robot 244 may contain a base 244a, a body 244b, and a main arm 244c. The base 244a may be installed to be movable along the guide rail 242. The body 244b may be joined to the base 244a. The body 244b may be provided to be movable on the base 244a along the third direction 16. Also, the body 244b may be provided to be rotatable on the base 244a. The main arm 244c may be joined to the body 244b such that it is forward and backward movable with respect to the body 144b. The main arm 244c may be in plurality, and the plurality of main arms 244c may be driven independently of each other. The main arms 244c may be arranged to be stacked, with main arms 244c spaced from each other along the third direction 16.

The process chamber 260 may contain a substrate treating apparatus 300 for cleaning a substrate W. A structure of the substrate treating apparatus 300 may be variable according to a type of cleaning process. Unlikely, the substrate treating apparatuses 300 of process chambers 260 may have the same structure. Optionally, the process chambers 260 may be divided into a plurality of groups. In this case, the substrate treating apparatuses 300 in the same group may have the same structure; on the other hand, the substrate treating apparatuses 300 in different groups may have different structures.

Figure 3:
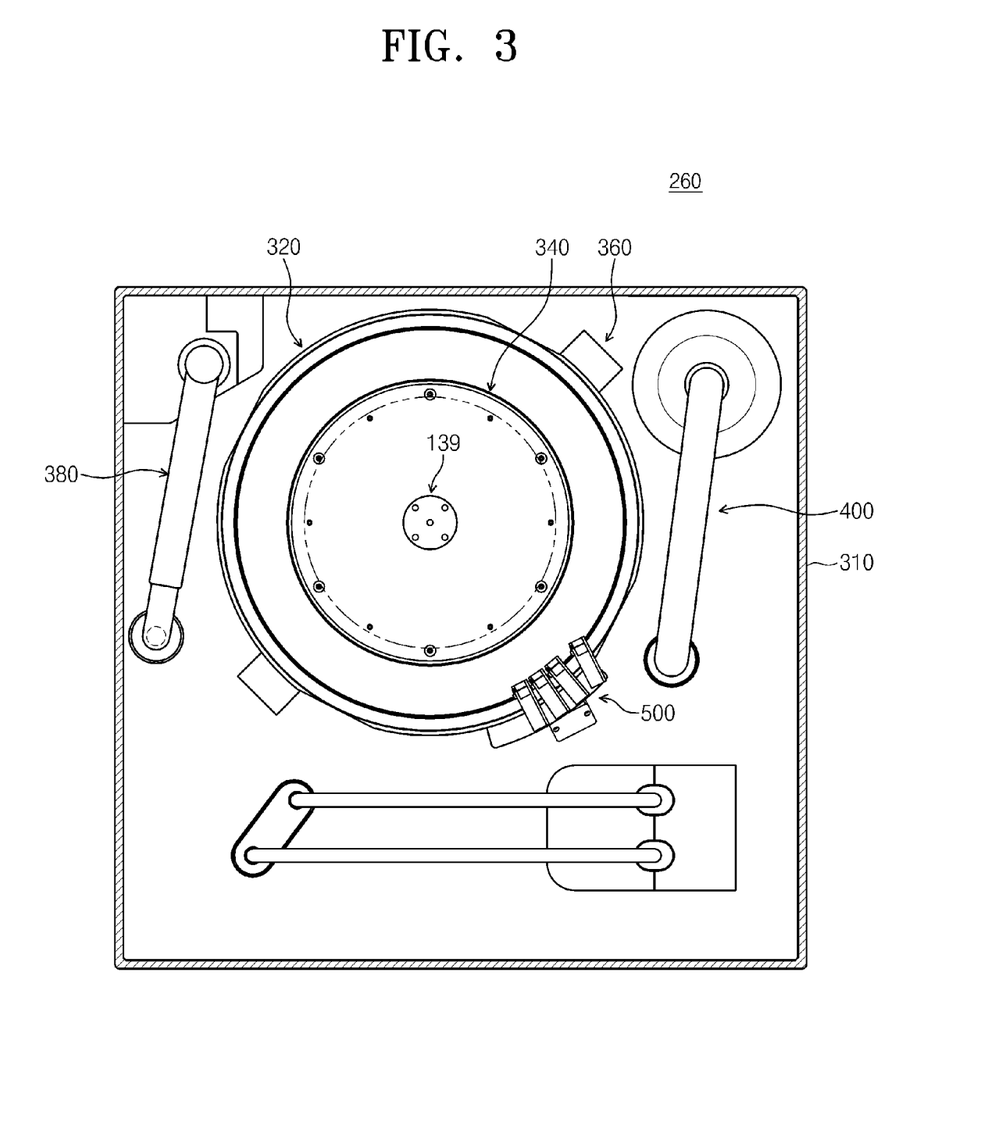
FIG. 3 is a plan view of a substrate treating apparatus of FIG. 2.
Figure 4:
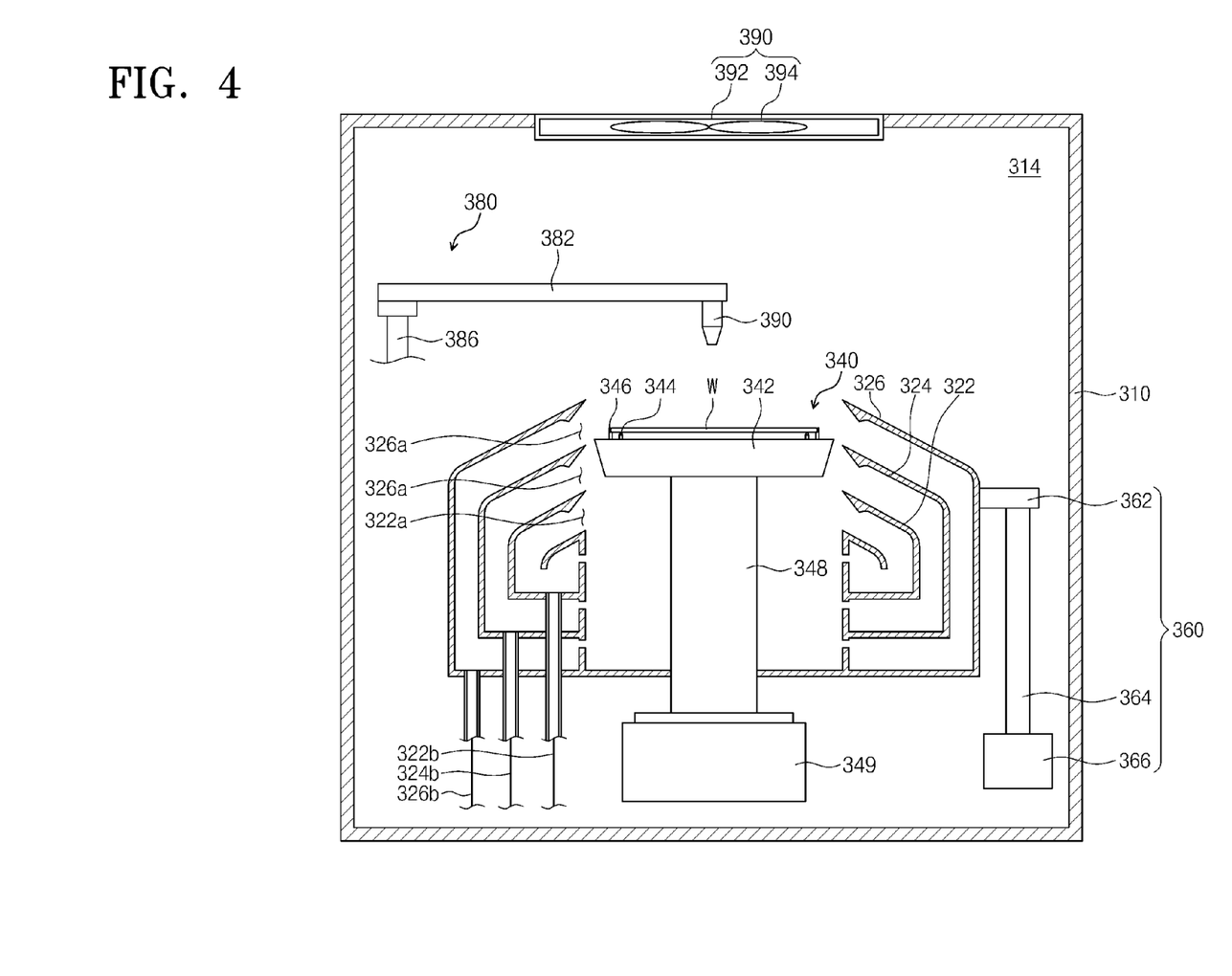
FIG. 4 is a cross-sectional view of a substrate treating apparatus of FIG. 3.

FIG. 3 is a plan view of a substrate treating apparatus of FIG. 2, and FIG. 4 is a cross-sectional view of a substrate treating apparatus of FIG. 3. Referring to FIGS. 3 and 4, a substrate treating apparatus 300 may contain a housing 320, a substrate support unit 340, an elevation unit 360, a liquid supply unit 380, an air current supply unit, and a door assembly 400.

The housing 310 may have a rectangular shape. A process space 314 may be provided in the housing 310. An opening 312 may be formed at a sidewall of the housing 310. The opening 312 may be used as an inlet through which a substrate W is input and output.

A container 320 may be placed at the process space to be opposite to the opening 312. The container 320 may have a cylindrical shape the upper surface of which is opened. Collection tanks (or containers) 322, 324, and 326 may collect different liquids used at a process, respectively. The inner collection tank 322 may be formed in a ring shape to surround the substrate support unit 340. The intermediate collection tank 324 may be formed in a ring shape to support the inner collection tank 322. The outer collection tank 326 may be formed in a ring shape to support the intermediate collection tank 324. An inner space 32a of the inner collection tank 322, a space 342a between the inner collection tank 322 and the intermediate collection tank 324, and a space 326a between the intermediate collection tank 324 and the outer collection tank 326 may function as inlets through which liquids flow into the inner collection tank 322, the intermediate collection tank 324, and the outer collection tank 326. According to an embodiment, collection lines (or pipes) 322b, 324b, and 326b may be connected with lower surfaces of the collection tanks 322, 324, and 326, respectively. Liquids flowing into the collection tanks 322, 324, and 326 may be provided and reused to an external liquid regeneration system (not shown) through the collection lines 322b, 324b, and 326b for reuse.

The substrate support unit 340 may support and rotate a substrate W being processed. The substrate support unit 340 may include a spin head 342, a support pin 344, a chuck pin 346, and a rotary shaft 348. The spin head 342 may have an upper surface which is formed in a circular shape when viewed from the above. An outer surface of the spin head 342 may be formed to have a step difference. The spin head 342 may be configured such that a diameter of a lower surface is smaller than that of an upper surface. The outer surface of the spin head 342 may be configured to be inclined downwards as it becomes closer to a center axis.

The support pin 344 may be in plurality. The support pins 344 may be arranged at an edge portion of the upper surface to be spaced from each other and may be protruded from the spin head 342 toward the top. The support pins 344 may be arranged to have a ring shape through mutual combination. The support pins 344 may support a rear edge of the substrate W such that the substrate W is spaced from the upper surface of the spin head 342.

The chuck pin 346 may be in plurality. The chuck pins 346 may be disposed to be further from the center axis of the spin head in comparison with the support pins 344. The chuck pins 346 may be configured to be protruded from the spin head 342 toward the top. The chunk pins 346 may support a lateral portion of a substrate W such that the substrate W does not leave from a predetermined (or its own) position in a lateral direction when the substrate support unit 340 rotates. The chuck pins 346 may be configured to move in a straight line between a waiting position and a support position according to a radius direction of the spin head 342. The waiting position may be a position that is further away from the center of the spin head 342 in comparison with the support position. The chuck pins 346 may be placed at the waiting position when the substrate W is loaded on or unloaded from the substrate support unit 340. The chuck pins 346 may be placed at the support position when the substrate W is being processed. The chuck pins 346 may contact with a lateral portion of the substrate W at the support position.

The rotary shaft 34 may be joined to the body 348 to rotate the spin head 342. The rotary shaft 34 may be placed under the spin head 342. The rotary shaft 348 may be configured such that its length direction orients in a third direction. The rotary shaft 348 may be fixedly joined to a lower surface of the spin head 342. The rotary shaft 348 may be configured to be rotatable by a driving member 349.

The elevation unit 360 may move a container 320 in a straight line and in an upward and downward direction. As the container 320 moves upwards and downwards, a relative height of the container 320 to the substrate support unit 340 may be variable. The elevation unit 360 may include a bracket 362, a movement shaft 364, and a driver 366. The bracket 362 may be fixedly installed at an outer wall of the container 320, and the movement shaft 364 that moves upward and downward by the driver 366 may be fixedly joined to the bracket 362. When the substrate W is put on the spin head 340 or is lift from the substrate support unit 340, the container 320 descends such that the substrate support unit 340 is protruded toward an upper portion of the container 320. Also, a height of the container 320 may be adjusted such that a liquid flows into a predetermined collection tank 360 according to a sort of liquid supplied to the substrate W being processed. Selectively, the elevation unit 360 may move the substrate support unit 340 in an upward direction.

The liquid supply unit 380 may jet a liquid onto the substrate W. The liquid supply unit 380 may be in plurality. The liquid supply units 380 may supply different sorts of liquids. The liquid supply unit 380 may include a support shaft 386, an arm 382, and a liquid nozzle 390. The support shaft 386 may be disposed at one side of the container 320. The support shaft 386 may have a load shape of which the length direction is provided in an upward and downward direction. The support shaft 386 may be rotatable and capable of being elevated by the driving member 388. Unlikely, the support shaft 386 may conduct a straight line movement and an elevation movement in a horizontal direction by the driving member 388. The arm 382 may support the liquid nozzle 390. The arm 382 may be joined to the support shaft 386, and the liquid nozzle 390 may be fixedly joined to a lower end thereof. The liquid nozzle 390 may conduct swing movement by rotation of the support shaft 386. As the support shaft 386 rotates, the liquid nozzle 390 may be movable to a process position and a waiting position. Here, the process position may be a position where the liquid nozzle 390 faces to the substrate support unit 340 and the waiting position may be a position where the liquid nozzle 390 gets out of the process position. According to an embodiment, a liquid may be chemical, rinse solution, and organic solvent. The chemical may contain sulfuric acid (H2SO3) or phosphoric acid (H3PO4). The rinse solution may be deionized (DI) water. The organic solvent may be Isopropyl Alcohol (IPA) solution.

The air current supply unit 390 may form down-flow air current in a process space. The down-flow air current may prevent floating of particle or fume generated in treating a substrate. The air current supply unit 390 may include a frame 394, an air current supply line (not shown), a fan 392, and a filter (not shown). The frame 394 may be installed at an upper portion of the housing 310. The frame 394 may be configured to have a square-ring shape. The air current supply line may be connected to the frame such that external air is supplied to the frame. The fan 392 may be installed at the air current supply line and may be rotatable such that the external air flows into the frame. The filter may be installed at the frame 394, and air passes though the filter such that particle contained therein is filtered. The air passing through the filter may be supplied to the process space.

The door assembly 400 may close and open the opening 312 formed at the sidewall of the housing 310.

Figure 5:
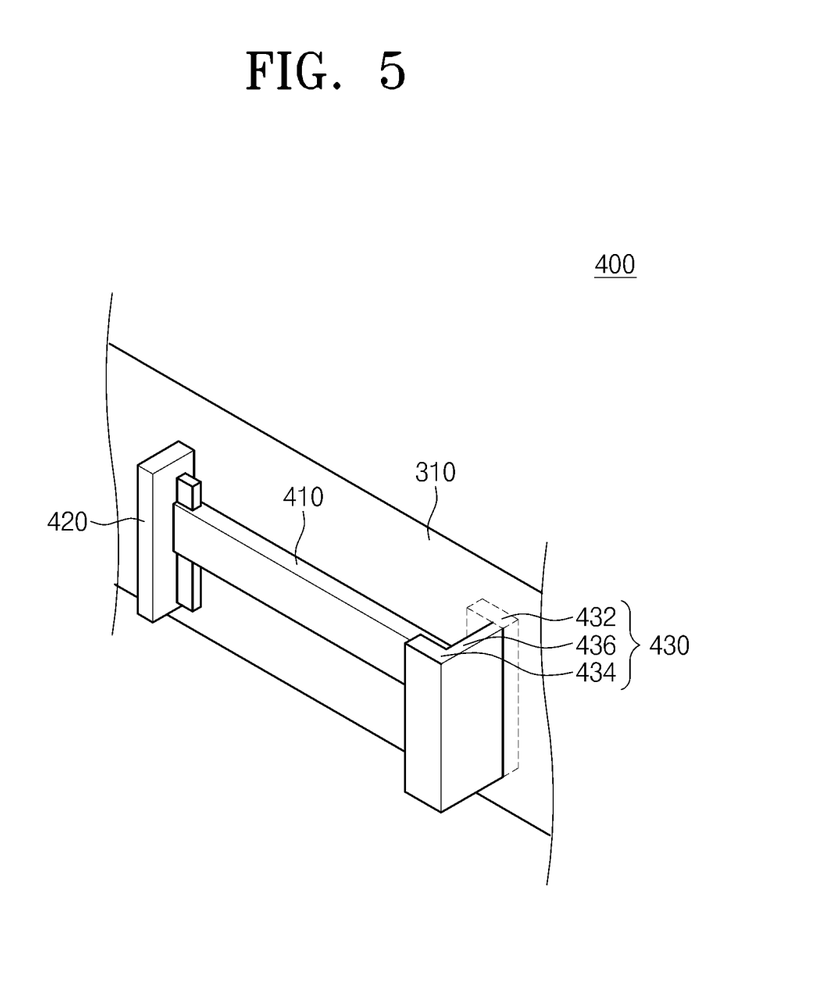
FIG. 5 is a perspective view of a door assembly of FIG. 4.
Figure 6:
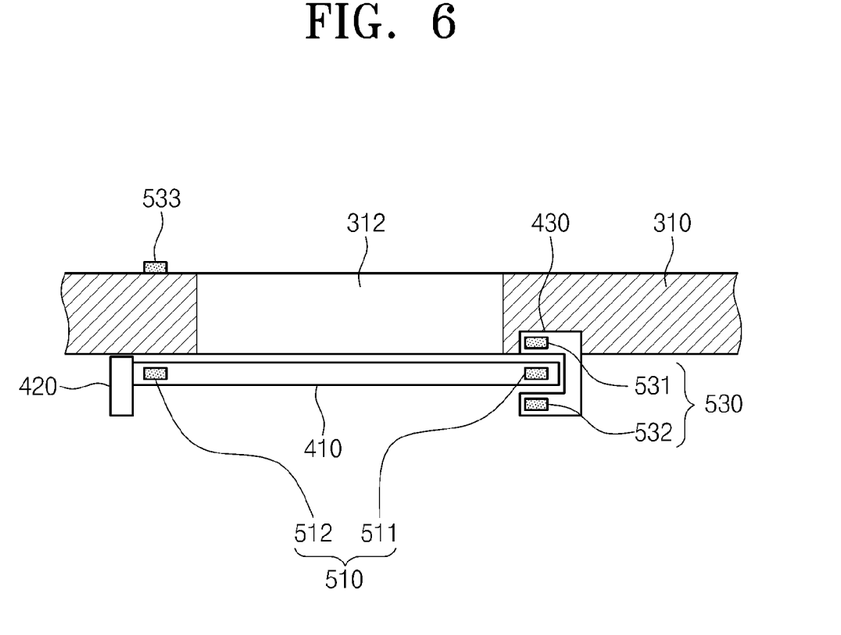
FIG. 6 is a horizontal cross-sectional view of a door assembly of FIG. 5.

FIG. 5 is a perspective view of a door assembly 400 of FIG. 4, and FIG. 6 is a horizontal cross-sectional view of a door assembly 400 of FIG. 5. Referring to FIGS. 5 and 6, a door assembly 400 may contain a shutter 410, a driving member 420, a guide member 430, and a gap maintaining unit 500.

The shutter 410 may open and close an opening 312. The shutter 410 may be configured to have a rectangular plate shape. The shutter 410 may be configured to have a rectangular shape of which the width and the height are greater, when viewed from the front, than those of the opening 312

The driving member 420 may transfer the shutter 410 between a blocking position and an open position. The driving member 420 may move the shutter 410 upward and downward. The driving member 420 may be placed to be adjacent to the opening 312 at a process space. The driving member 420 may be placed not to be overlapped with the opening 312 when the opening 312 is viewed from the front. Here, the blocking position may be a position where the shutter 410 faces to the opening 312, and the open position may be a position that gets out of the blocking position. For example, the open position may be a lower position of the opening 312. One end of the shutter 410 may be connected to the driving member 420. The driving member 420 may be provided at a cylinder for moving the shutter 410 by pressuring or decompressing.

The guide member 430 may prevent the shutter 410 from getting out of its own position. The guide member 430 may include bodies 432, 434, and 436. The bodies 432, 434, and 436 may be extended from a sidewall of the housing 310 toward an inward direction of the housing 310. The bodies 432, 434, and 436 may be extended from the sidewall of the housing 310 so as to be placed in a process space 314. The bodies 432, 434, and 436 may be placed to face to the driving member 410, with the shutter 410 interposed therebetween at the process space 314. The bodies 432, 434, and 436 may be configured such that a length direction thereof faces to an upward and downward direction. The bodies 432, 434, and 436 may be configured to surround the other end of the shutter 410.

The bodies 432, 434, and 436 may include a first plate 432, a second plate 434, and a connection part 436. The first plate 432 may be placed to face to the second plate 434. The first shutter 432 may be placed between the shutter 410 and the sidewall of the housing 310. The first plate 432 may be configured such that its length direction faces to an upward and downward direction. A length of the first plate 432 may be equal to or longer than that of a straight line connecting an open position and a blocking position of the shutter 410. The second plate 434 may be placed to face to the first plate with the shutter 410 interposed therebetween. The second plate 434 may be symmetrical about the first plate 432 with the shutter 410 as the center. A distance between the first plate 432 and the second plate 434 may be greater than a width of the shutter 410. Accordingly, the shutter 410 may be placed to be spaced from the first plate 432 and the second plate 434. The connection part 436 may connect the first plate 432 and the second plate 434. The connection part 436 may be vertically extended from the first plate 432 and the second plate 434. Accordingly, the bodies 432, 434, and 436 may form a square bracket (]) shape when viewed from the above, and the other end of the shutter 410 may be configured to be surrounded by the first plate 432, the second plate 434, and the connection part 436.

The gap maintaining unit 500 may allow a constant gap to be maintained between the shutter 410 and one sidewall of the housing 310. The gap maintaining unit 500 may adjust the constant gap using magnetism. The gap maintaining unit 500 may include an inner magnetism member 510 and an outer magnetism member 530. The inner magnetism member 510 and the outer magnetism member 530 may constitute a magnetic member where repulsive force acts between the inner magnetism member 510 and the outer magnetism member 530.

The inner magnetism member 510 may be provided at the shutter 410. The inner magnetism member 510 may include a first inner magnetic 511 and a second inner magnetic 512. The first inner magnetic 511 may be provided at the other end of the shutter 410, and the second inner magnetic 512 may be provided at one end of the shutter 410. Here, an area of the shutter 410 where the first inner magnetic 511 and the second inner magnetic 512 are provided may be an area that does not face to the opening 312.

The outer magnetism member 530 may include a first outer magnetic 531, a second outer magnetic 532, and a third outer magnetic 533. The first outer magnetic 531 may be provided at the first plate 432 of the bodies 432, 434, and 436. The first outer magnetic 531 may be configured such that its length direction orients in an upward and downward direction and may be placed to face to the first inner magnetic 511. A length of the first outer magnetic 531 may be equal to or longer that a length linking a blocking position and an open position of the shutter 410. The first outer magnetic 531 may be configured such that repulsive force acts between the first outer magnetic 531 and the first inner magnetic 511. The second outer magnetic 532 may be provided at the second plate 434 of the bodies 432, 434, and 436. The second outer magnetic 532 may be placed to face to the first outer magnetic 531 and may be configured to have the same shape of the first outer magnetic 531. The second outer magnetic 532 may be configured such that repulsive force acts between the second outer magnetic 532 and the first inner magnetic 511. According to an embodiment, the first outer magnetic 531 and the second outer magnetic 532 may be configured to have the same magnetism. Each of the first outer magnetic 531 and the second outer magnetic 532 may be configured to have magnetism greater than the first inner magnetic 511.

The third outer magnetic 533 may be provided at a sidewall of the housing 310. The third outer magnetic 533 may be provided at an outer area of the sidewall. The third outer magnetic 533 may be placed to face to one end of the shutter 410. The third outer magnetic 533 may be placed to face to the second inner magnetic 512. The third outer magnetic 533 may be configured such that its length direction orients in an upward and downward direction. A length of the third outer magnetic 533 may be equal to or longer that a length linking a blocking position and an open position of the shutter 410. The third outer magnetic 533 may be configured such that repulsive force acts between the third outer magnetic 533 and the second inner magnetic 512.

Selectively, the third outer magnetic 533 may be provided at an inner area, corresponding to the process space 314, from among the sidewall of the housing.

Figure 7:
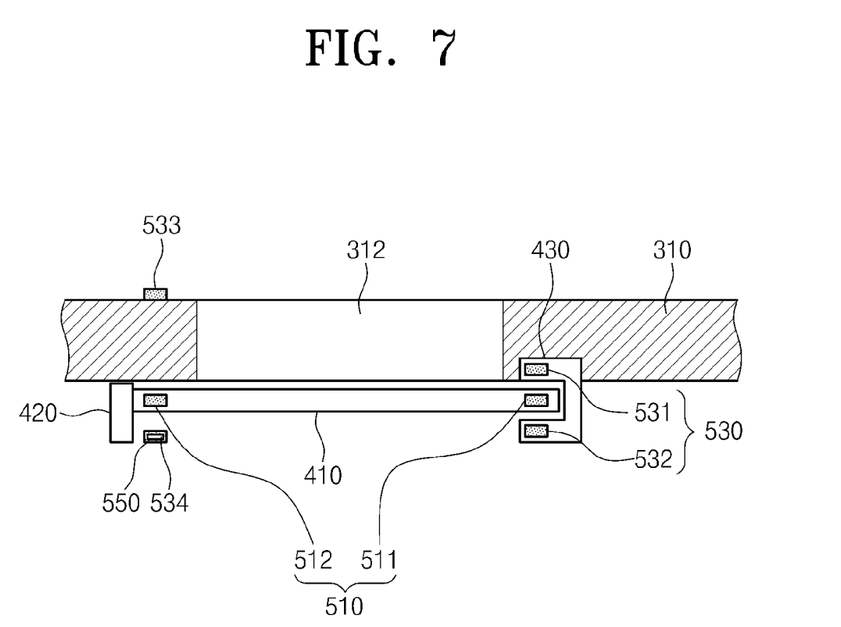
FIG. 7 is a horizontal cross-sectional view of a door assembly of FIG. 6, according to another exemplary embodiment of the inventive concept.

An embodiment of the inventive concept is exemplified as the outer magnetism member 530 includes three magnetics and the inner magnetism member 510 includes two magnetics. However, as illustrated in FIG. 7, the outer magnetism member 530 may further include a fourth outer magnetic 534. Also, a guide bar 550 may be further installed which is placed to face to one end of the shutter 410. The guide bar 550 may be placed to face to the sidewall of the housing with one end of the shutter 410 interposed therebetween. The guide bar 550 may be configured such that its length direction orients to an upward and downward direction, and a length of the guide bar 550 may be equal to or longer that a length linking a blocking position and an open position of the shutter 410. The fourth outer magnetic 534 may be provided at the guide bar 550. The fourth outer magnetic 534 may be configured such that repulsive force acts between the fourth outer magnetic 534 and the second inner magnetic 512.

Also, an embodiment of the inventive concept is exemplified as one opening 312 is formed at the housing 310. However, a plurality of openings can be formed at one sidewall of the housing 310. The openings 312 may be arranged along an upward and downward direction and may be spaced from each other. A part of the plurality of openings 312 may be used as substrate input and output holes, and remaining openings 312 may be used as substrate reversing holes.

Also, an embodiment of the inventive concept is exemplified as the door assembly 400 is applied to the housing 310 for performing a cleaning process therein. However, a substrate treating apparatus can be applied to various processes such as an etching process, a deposition process, a develop process, and an ashing process, etc.

According to an exemplary embodiment of the inventive concept, a magnetism member may be provided at each of housing and a shutter, thereby making it possible to maintain a constant gap between the housing and the shutter.

According to an exemplary embodiment of the inventive concept, also, a guide member may be configured to surround a part of the shutter, and the magnetism member may be provided at areas where the shutter and the guide member are opposite to each other. In this case, repulsive force may act between the shutter and the guide member, thereby preventing the shutter from contacting with the housing.

According to an exemplary embodiment of the inventive concept, a magnetism of an outer magnetism member provided at the guide member may be stronger than that of an inner magnetism member provided at the shutter, thereby preventing the shutter from getting out of a predetermined position due to magnetic repulsive power from the outer magnetism member.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a housing configured to provide a process space for treating a substrate therein and having an opening formed at a sidewall thereof; and
   a door assembly configured to open and close the opening, wherein the door assembly comprises:
   a shutter formed on a first side of the sidewall;
   a driving member configured to transfer the shutter to a blocking position where the shutter faces to the opening and to an open position where the shutter gets out of the blocking position; and
   a gap maintaining unit configured to maintain a constant gap between the shutter and the first side of the sidewall,
   wherein one end of the shutter is connected to the driving member,
   wherein the gap maintaining unit comprises a first inner magnetic provided at the shutter, and
   wherein the first inner magnetic is provided at the other end of the shutter.

2. The substrate treating apparatus of claim 1, wherein the gap maintaining unit maintains the constant gap using magnetism.

3. The substrate treating apparatus of claim 2, wherein the gap maintaining unit further comprises an outer magnetism member placed at the outside of the shutter to face the first inner magnetic.

4. The substrate treating apparatus of claim 3, wherein the first inner magnetic and the outer magnetism member are configured such that repulsive power acts between the first inner magnetic and the outer magnetism member.

5. The substrate treating apparatus of claim 4, further comprising:
   a guide member configured to guide a movement of the shutter and having a body placed to be spaced from the shutter,
   wherein the body includes a first plate and a second plate spaced from and opposite to each other,
   wherein the other end of the shutter is inserted between the first plate and the second plate, and
   wherein the outer magnetism member comprises:
   a first outer magnetic provided at the first plate; and
   a second outer magnetic provided at the second plate.

6. The substrate treating apparatus of claim 5, wherein magnetism of each of the first and second outer magnetics has greater than that of the first inner magnetic.

7. The substrate treating apparatus of claim 6, wherein the first and second outer magnetics have the same magnetism.

8. The substrate treating apparatus of claim 4, wherein the gap maintaining unit further comprises a second inner magnetic provided at the one end of the shutter, and
   wherein the substrate treating apparatus further comprises a third outer magnetic provided at a second side of the sidewall, such that the third outer magnetic is positioned opposite the second inner magnetic.

9. The substrate treating apparatus of claim 4, wherein the outer magnetism member is extended from a position facing the blocking position up to an area facing the open position.

10. The substrate treating apparatus of claim 1, further comprising:
    a fan filter unit configured to form an air current at the process space;
    a substrate support unit configured to support a substrate at the process space; and
    a liquid supply unit configured to supply a liquid on the substrate supported by the substrate support unit.

* * * * *